(12) United States Patent
Imada et al.

(10) Patent No.: US 10,971,657 B2
(45) Date of Patent: Apr. 6, 2021

(54) LIGHT EMITTING MODULE AND METHOD OF MANUFACTURING THE SAME

(71) Applicant: NICHIA CORPORATION, Anan (JP)

(72) Inventors: Mamoru Imada, Anan (JP); Toshiaki Moriwaki, Itano-gun (JP); Yusaku Achi, Tokushima (JP); Ryohei Yamashita, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/529,005

(22) Filed: Aug. 1, 2019

(65) Prior Publication Data
US 2020/0044121 A1     Feb. 6, 2020

(30) Foreign Application Priority Data
Aug. 3, 2018   (JP) .............................. JP2018-146668

(51) Int. Cl.
| | | |
|---|---|---|
| *H01L 33/50* | (2010.01) | |
| *H01L 33/10* | (2010.01) | |
| *H01L 33/36* | (2010.01) | |
| *H01L 33/54* | (2010.01) | |
| *G02F 1/13357* | (2006.01) | |
| *H01L 33/62* | (2010.01) | |
| *F21V 8/00* | (2006.01) | |

(52) U.S. Cl.
CPC ............ *H01L 33/502* (2013.01); *H01L 33/10* (2013.01); *H01L 33/36* (2013.01); *H01L 33/54* (2013.01); *G02B 6/0011* (2013.01); *G02F 1/133602* (2013.01); *H01L 33/62* (2013.01)

(58) Field of Classification Search
None
See application file for complete search history.

(56) References Cited

U.S. PATENT DOCUMENTS 8,899,811 B2 * 12/2014 Jung .................... G02B 6/0083
362/612
2007/0195524 A1    8/2007 Seo et al.
(Continued)

FOREIGN PATENT DOCUMENTS

| JP | 2005038776 A | 2/2005 |
| JP | 2007214076 A | 8/2007 |

(Continued)

*Primary Examiner* — Zandra V Smith
*Assistant Examiner* — Lawrence C Tynes, Jr.
(74) *Attorney, Agent, or Firm* — Hunton Andrews Kurth LLP

(57) ABSTRACT

A light emitting module includes: a plurality of light emitting elements each having a primary light emitting surface and a lateral surface; a plurality of wavelength conversion members arranged respectively on the primary light emitting surfaces of the plurality of light emitting elements; and a lightguide plate having a first primary surface and a second primary surface and arranged continuously on the plurality of wavelength conversion members so that the second primary surface faces the plurality of wavelength conversion members, wherein the lightguide plate includes a plurality of recessed portions located on the second primary surface, and a lateral surface of at least one of the plurality of wavelength conversion members is partially in contact with an inner lateral surface of at least one of the plurality of recessed portions.

13 Claims, 12 Drawing Sheets

(56) References Cited

U.S. PATENT DOCUMENTS

| | | | |
|---|---|---|---|
| 2009/0091920 A1* | 4/2009 | Naijo | G02F 1/133603 |
| | | | 362/97.3 |
| 2011/0096560 A1* | 4/2011 | Ryu | C09K 11/7734 |
| | | | 362/510 |
| 2011/0149594 A1 | 6/2011 | Terajima et al. | |
| 2011/0164402 A1 | 7/2011 | Kang et al. | |
| 2012/0013811 A1 | 1/2012 | Shimizu | |
| 2012/0326193 A1 | 12/2012 | Park et al. | |
| 2015/0036317 A1* | 2/2015 | Yamamoto | F21V 9/30 |
| | | | 362/84 |
| 2019/0049649 A1* | 2/2019 | Hayashi | G02F 1/133606 |
| 2020/0013933 A1* | 1/2020 | Daikoku | G02B 6/0011 |
| 2020/0041836 A1* | 2/2020 | Imada | G02F 1/133603 |
| 2020/0064687 A1* | 2/2020 | Imada | G02F 1/133504 |
| 2020/0105973 A1* | 4/2020 | Kasai | G02B 6/0036 |
| 2020/0176650 A1* | 6/2020 | Achi | H01L 33/58 |
| 2020/0209458 A1* | 7/2020 | Yuu | H01L 33/505 |
| 2020/0209461 A1* | 7/2020 | Achi | G02B 6/0021 |
| 2020/0284968 A1* | 9/2020 | Yamashita | G02B 6/0083 |
| 2020/0285114 A1* | 9/2020 | Yamashita | G02B 6/0078 |

FOREIGN PATENT DOCUMENTS

| | | |
|---|---|---|
| JP | 2007227373 A | 9/2007 |
| JP | 2008059786 A | 3/2008 |
| JP | 2010008837 A | 1/2010 |
| JP | 2010-238846 A | 10/2010 |
| JP | 2011134485 A | 7/2011 |
| JP | 2011142079 A | 7/2011 |
| JP | 2011211085 A | 10/2011 |
| JP | 2013008941 A | 1/2013 |
| JP | 2015-012081 A | 1/2015 |
| JP | 2015032373 A | 2/2015 |
| JP | 2016081786 A | 5/2016 |
| JP | 2017-183427 A | 10/2017 |
| WO | 2010113361 A1 | 10/2010 |
| WO | 2012141094 A1 | 10/2012 |

* cited by examiner

LIGHT EMITTING MODULE AND METHOD OF MANUFACTURING THE SAME

CROSS-REFERENCE TO RELATED APPLICATION

This application claims priority to Japanese Patent Application No. 2018-146668, filed on Aug. 3, 2018, the disclosure of which is hereby incorporated by reference in its entirety.

BACKGROUND

The present disclosure relates to a light emitting module and a method of manufacturing the same.

Light emitting devices using light emitting elements such as light emitting diodes are widely used as backlights of liquid crystal display devices or as various light sources. For example, the light source device disclosed in Japanese Patent Publication No. 2015-32373 includes a plurality of light emitting elements mounted on a mounting substrate, semispherical lens members respectively covering the light emitting elements, and a diffuser member arranged thereabove upon which light from the light emitting elements is incident.

SUMMARY

In recent years, there has been a demand for thinner display devices, and hence for thinner backlights. With such a light source device as that disclosed in Japanese Patent Publication No. 2015-32373, for example, the distance between the mounting substrate and the diffuser needs to be larger than the thickness of the lens members, and it may be difficult to achieve a sufficient thickness reduction. The present disclosure provides a light emitting module whose thickness can be reduced.

A light emitting module according to one embodiment of the present disclosure includes: a plurality of light emitting elements each having a primary light emitting surface and a lateral surface; a plurality of wavelength conversion members arranged respectively on the primary light emitting surfaces of the plurality of light emitting elements; and a lightguide plate having a first primary surface and a second primary surface and arranged continuously on the plurality of wavelength conversion members so that the second primary surface faces the plurality of wavelength conversion members, wherein the lightguide plate includes a plurality of recessed portions located on the second primary surface, and a lateral surface of at least one of the plurality of wavelength conversion members is partially in contact with an inner lateral surface of at least one of the plurality of recessed portions.

According to the present disclosure, it is possible to realize a thin light emitting module.

DETAILED DESCRIPTION

Embodiments of light emitting modules according to the present disclosure will now be described in detail with reference to the drawings. Note that while terms indicating specific directions and positions (e.g., "upper", "lower", and other terms including such terms) are used as necessary in the description below, these terms are used for ease of understanding of the disclosure with reference to the drawings, and the technical scope of the subject matter of the present disclosure is not limited by the meaning of these terms. Each part with the same reference sign appearing in different figures represents the same or equivalent part or member.

Moreover, the embodiment to be shown below is for illustrating a light emitting module that embodies the technical concept of the subject matter of the present disclosure, and it is not intended to limit the subject matter of the present disclosure to the description below. The size, material, shape, relative arrangement, etc., of the components described below are intended to be illustrative but not to limit the scope of the subject matter of the present disclosure thereto, unless otherwise specified. Descriptions used in one embodiment or example are applicable to other embodiments or other examples. The size, positional relationship, etc., of the members shown in each figure may be exaggerated in order to facilitate the understanding.

(Liquid Crystal Display Device 1000)

Figure 1:
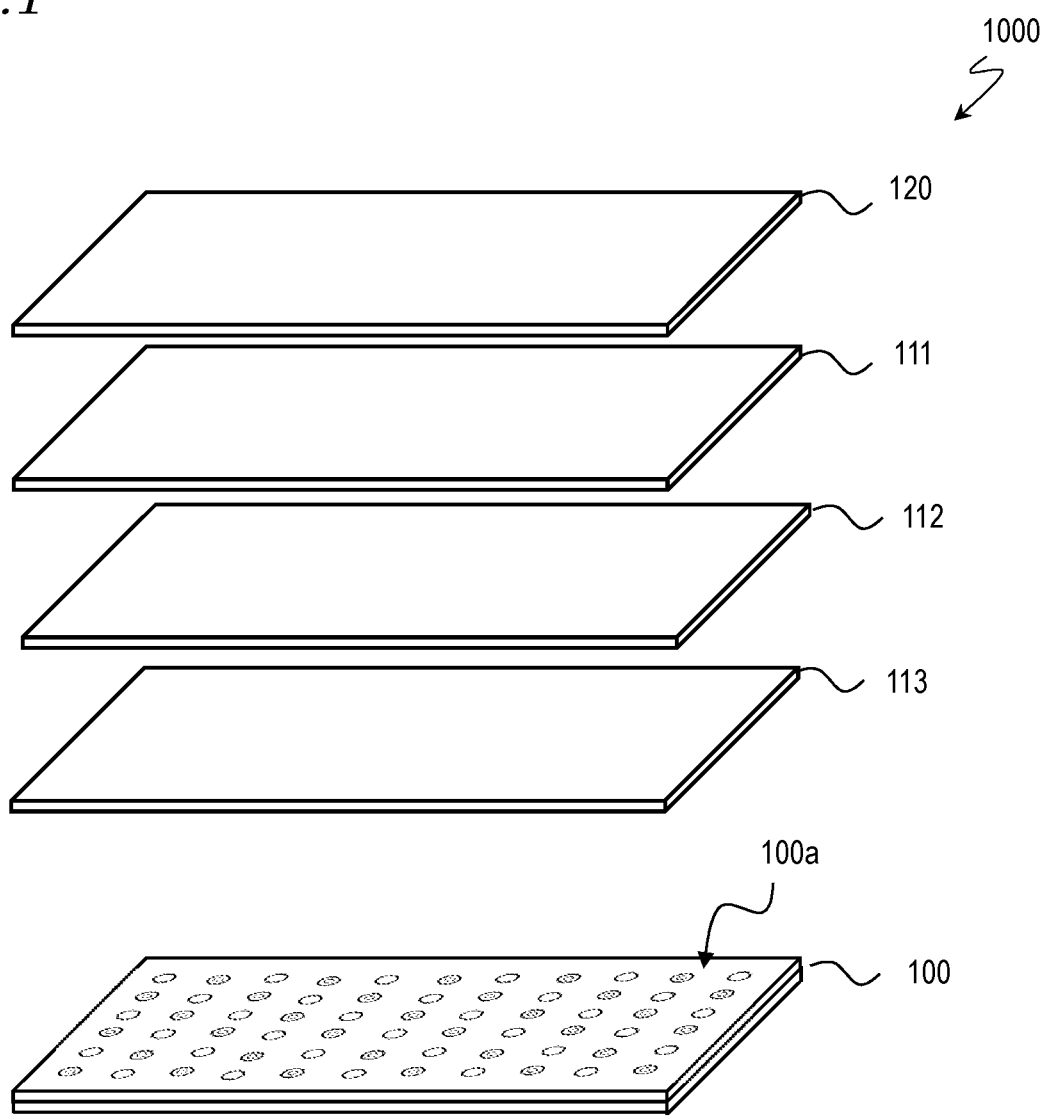
FIG. 1 is an exploded perspective view showing a liquid crystal display device of an embodiment of the present disclosure.

FIG. 1 is a schematic exploded perspective view showing elements of a liquid crystal display device 1000 of the present embodiment. The liquid crystal display device 1000 includes a light emitting module 100, a liquid crystal panel 120, and lens sheets 111 and 112 and a diffusion sheet 113 located between the light emitting module 100 and the liquid crystal panel 120. In the present embodiment, the diffusion sheet 113 is arranged on the light emitting module 100 side relative to the lens sheets 111 and 112.

The number of lens sheets and the number of diffusion sheets of the liquid crystal display device 1000 are not limited to those shown in FIG. 1. For example, the liquid crystal display device 1000 may include two or more diffusion sheets. The liquid crystal display device 1000 may further include other members such as a polarizer film, a color filter, a luminance enhancement film and a reflector.

The light emitting module 100 is a surface-emitting light source and emits light from across the entirety of a primary surface 100a. Light emitted from the light emitting module 100 is randomly diffused when passing through the diffusion sheet 113. Thus, the unevenness in luminance is suppressed. The lens sheets 111 and 112 refract light having passed through the diffusion sheet 113 so that the light is incident upon the liquid crystal panel 120 as perpendicular thereto as possible.

As will be described below, a plurality of light emitting elements are arranged in a two-dimensional array below the primary surface 100a of the light emitting module 100, and the light emitting module 100 forms a direct backlight. In the light emitting module 100, a plurality of light emitting elements are provided on a lightguide plate, and the lightguide plate is provided with a portion that functions as a lens for controlling the light distribution. Thus, the overall thickness of the light emitting module 100 is small.

(Light Emitting Module 100)

Figure 2A:
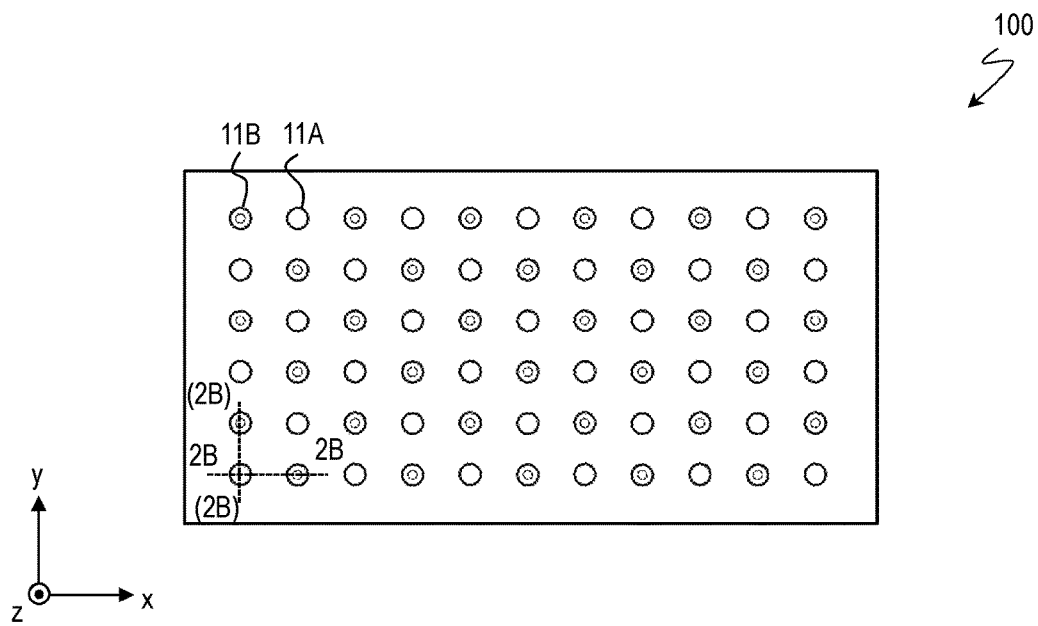
FIG. 2A is a schematic top view showing a light emitting module of an embodiment of the present disclosure.
Figure 2B:
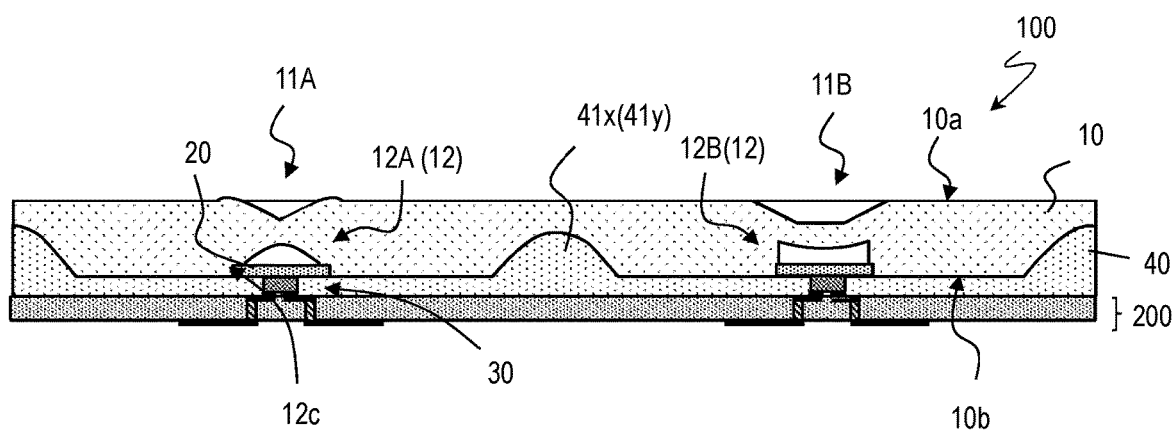
FIG. 2B is a schematic cross-sectional view of the light emitting module taken along line 2B-2B of FIG. 2A.
Figure 2C:
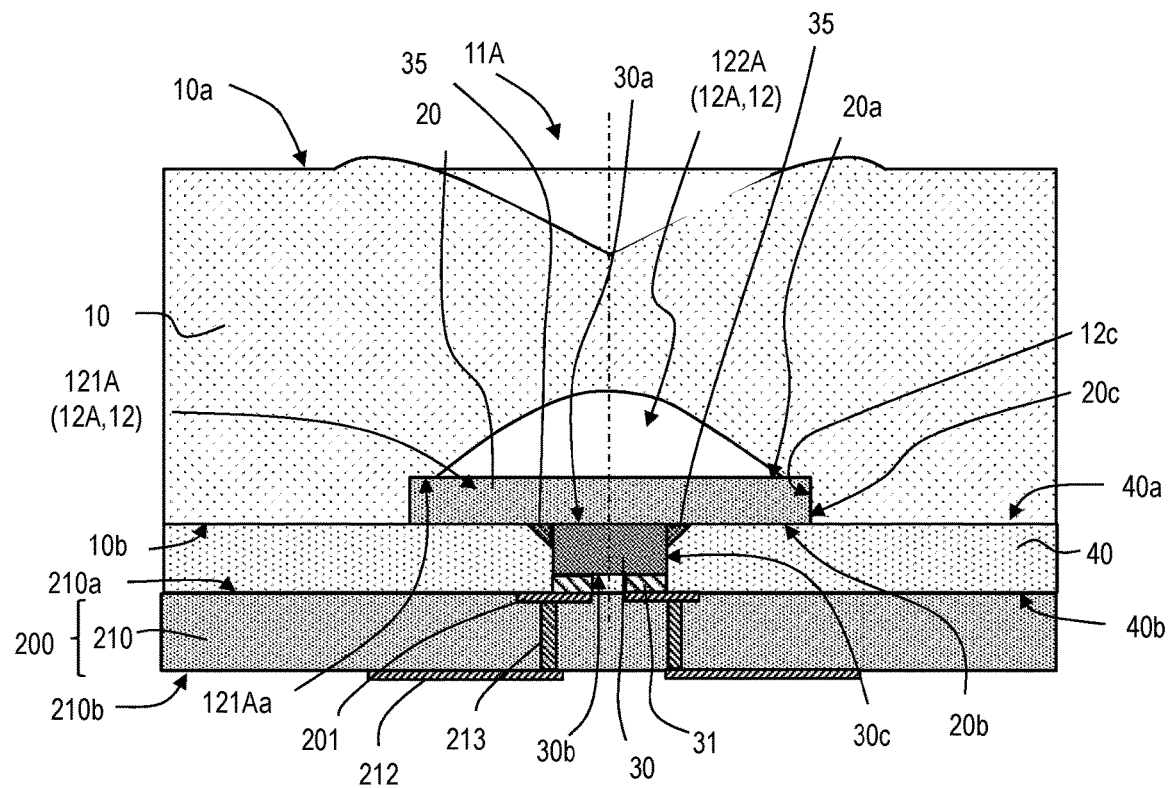
FIG. 2C is an enlarged schematic cross-sectional view showing a part of FIG. 2B.
Figure 2D:
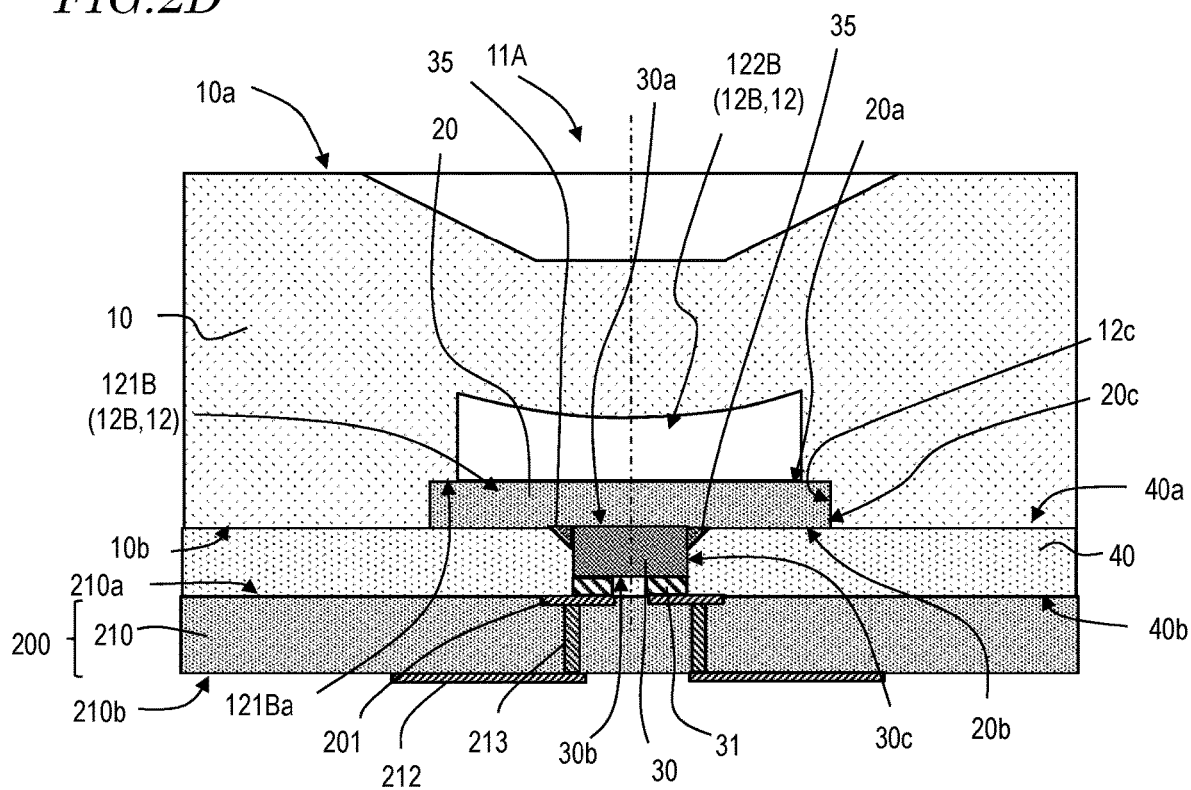
FIG. 2D is an enlarged schematic cross-sectional view showing another part of FIG. 2B.

An embodiment of the light emitting module 100 will be described in detail. FIG. 2A is a schematic top view of the light emitting module 100, and FIG. 2B is a schematic cross-sectional view of the light emitting module 100 taken along line 2B-2B of FIG. 2A. While line 2B-2B is parallel to the x axis, a cross section that is parallel to the y axis has the same structure. FIG. 2C and FIG. 2D are enlarged schematic cross-sectional views each showing a part of FIG. 2B. The light emitting module 100 includes the lightguide plate 10, a plurality of wavelength conversion members 20, and a plurality of light emitting elements 30.

The light emitting element 30 has a primary light emitting surface 30a and a lateral surface 30c, and a plurality of wavelength conversion members 20 are arranged on the primary light emitting surface 30a of a plurality of light emitting elements 30.

The lightguide plate 10 has a first primary surface 10a and a second primary surface 10b, and the lightguide plate 10 is arranged continuously over the wavelength conversion members 20 so that the second primary surface 10b faces the wavelength conversion members 20. The lightguide plate 10 includes a plurality of recessed portions 12 located on the second primary surface. As will be described below, in the present embodiment, the recessed portions 12 include recessed portions 12A and recessed portions 12B, which have different cross-sectional shapes. As shown in FIG. 2B and FIG. 2C, the wavelength conversion member 20 is arranged in the recessed portion 12, and a lateral surface 20c of the wavelength conversion member 20 is in contact with an inner lateral surface 12c of the recessed portion 12. The configuration of each section of the light emitting module 100 will now be described in detail.

[Lightguide Plate 10]

The lightguide plate 10 is a light-transmitting member that receives light from the light emitting element 30 and gives a planar light emission. The lightguide plate 10 of the present embodiment has the first primary surface 10a, which is the light emitting surface, and the second primary surface 10b located on the opposite side from the first primary surface 10a.

Figure 8A:
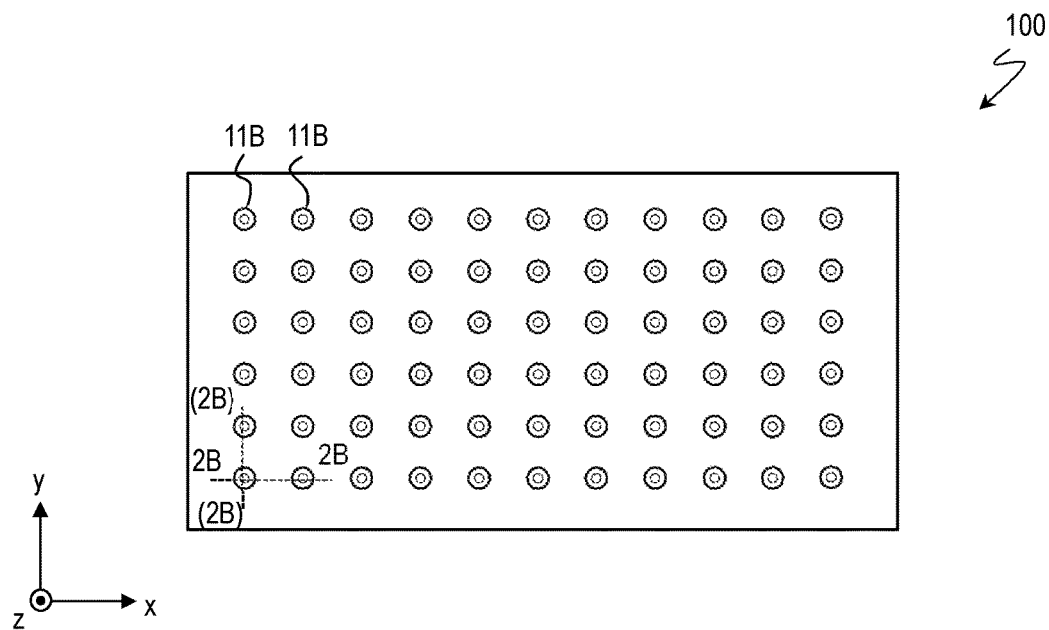
FIG. 8A is a schematic top view showing a light emitting module of another embodiment of the present disclosure.
Figure 8B:
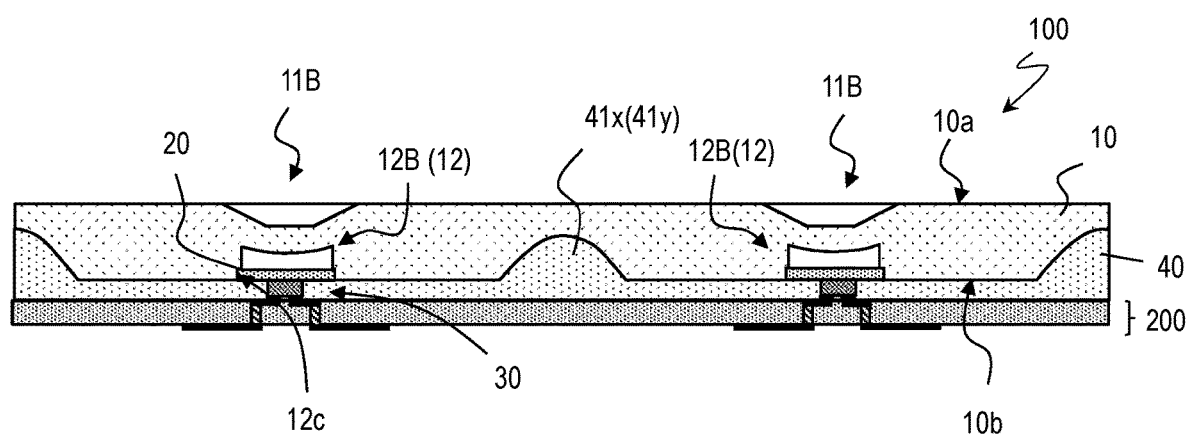
FIG. 8B is a schematic cross-sectional view of the light emitting module taken along line 2B-2B of FIG. 8A.

The first primary surface 10a may be flat, or may include an optical element arranged thereon that functions as an optical lens and has the light distributing function of adjusting the direction and the distribution of the emitted light. For example, as shown in FIG. 2A and FIG. 2B, in the present embodiment, the lightguide plate 10 has a plurality of optical function portions 11A and a plurality of optical function portions 11B that have different shapes from each other on the first primary surface 10a. The optical function portions 11A and 11B are arranged two-dimensionally in the x-axis direction and the y-axis direction on the first primary surface 10a. In the present embodiment, the optical function portions 11A and 11B are arranged two-dimensionally in a matrix pattern along the x-axis direction and the y-axis direction on the first primary surface 10a. The optical function portions 11A and the optical function portions 11B are arranged alternating with each other both in the x direction and in the y direction. The arrangement of the optical function portions 11A and 11B in the present embodiment is merely an example, and there is no limitation on the arrangement of the optical function portions 11A, and 11B. For example, either the optical function portions 11A or the optical function portions 11B may be arranged on the first primary surface 10a. For example, as shown in FIG. 8A and FIG. 8B, the light emitting module 100 may only include the optical function portions 11B arranged two-dimensionally on the first primary surface 10a of the lightguide plate 10. When the optical function portions 11A and 11B are arranged on the first primary surface 10a, the ratio between the number of the optical function portions 11A and the number of the optical function portions 11B is not limited to 1:1 but may be any other ratio.

The optical function portions 11A and 11B have a shape of a recessed portion, a protruding portion, or a combination thereof, provided on the first primary surface 10a. By virtue of the shape thereof, the optical function portions 11A and 11B refract light passing therethrough to adjust the light distribution. In the present embodiment, the optical function portion 11A has a shape that is obtained by combining together a recessed portion of an inverted cone-shaped (a cone shape that has the bottom surface on the first primary surface 10a) and a ring-shaped protruding portion projecting from the first primary surface 10a along the opening of the recessed portion. The optical function portion 11B is a recessed portion that has an inverted truncated cone shape (a truncated cone shape that has the bottom surface on the first primary surface 10a).

It is preferred that the light emitting module 100 of the present disclosure can emit light, which is emitted from the light emitting elements 30, in a widespread emission in as short a distance as possible from the light emitting elements in order to realize a thin surface-emitting light source. Therefore, it is preferred that each of the optical function portions 11A and 11B has an optical axis and has a depressed shape such that the opening on the first primary surface 10a is larger than that on the bottom portion. For example, it is preferred that the optical function portion 11A and the optical function portion 11B have an inverted polygonal pyramid such as an inverted cone shape, an inverted quadrangular pyramid shape or an inverted hexagonal pyramid shape. The recessed portion is a void, which may be filled with air, for example, or with a material having a different refractive index than that of the material of the lightguide plate 10. The optical function portion 11A and the optical function portion 11B may further include a light-reflective member such as a metal or a white resin arranged in a portion of the shape.

Figure 3A:
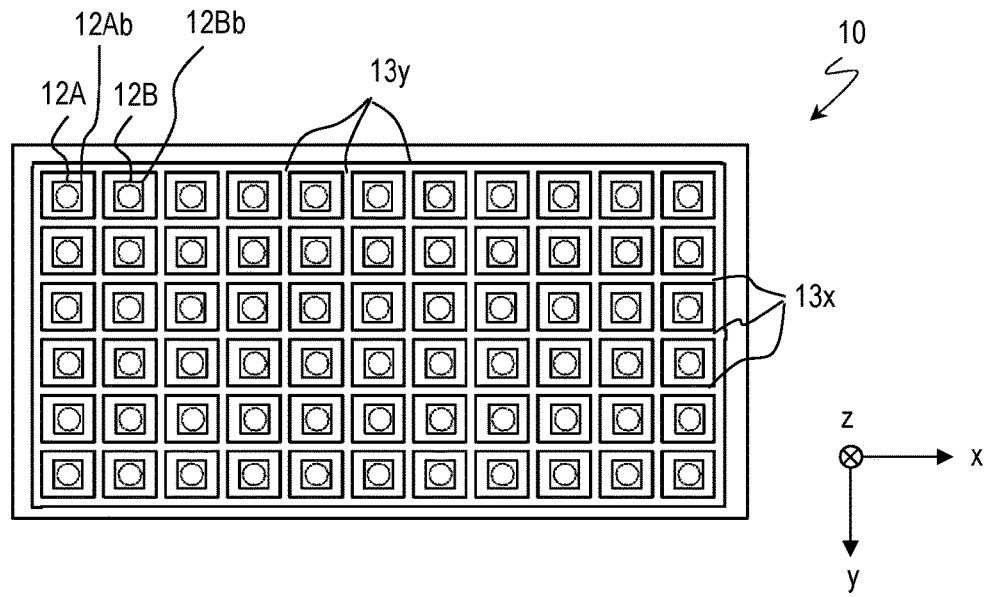
FIG. 3A is a schematic bottom view showing a lightguide plate.
Figure 3B:
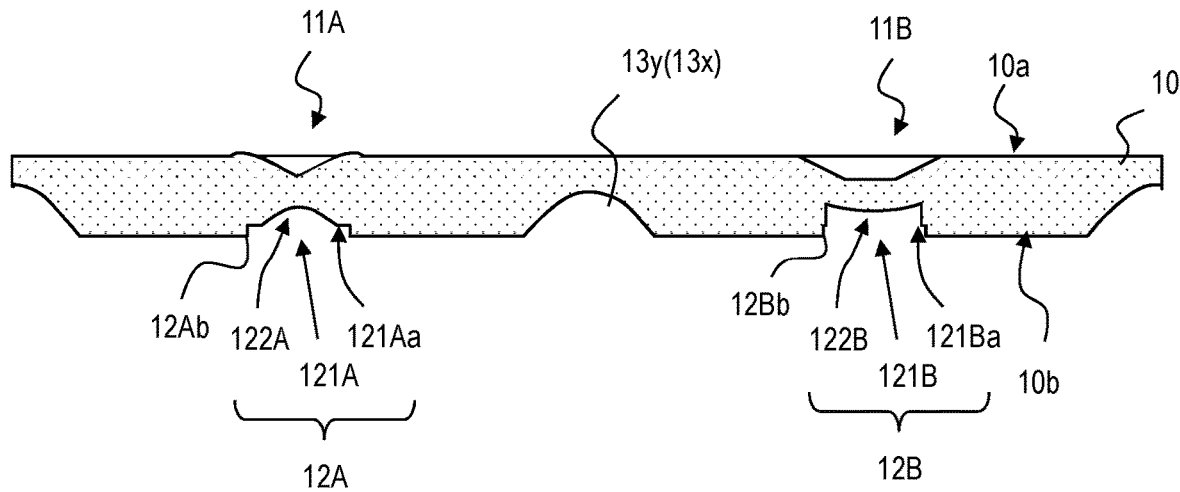
FIG. 3B is a cross-sectional view showing the lightguide plate at the position of line 2B-2B of FIG. 2A.

FIG. 3A is a bottom view showing the lightguide plate 10, and FIG. 3B is a cross-sectional view showing the lightguide plate 10 at the position of line 2B-2B of FIG. 2A. The lightguide plate 10 includes a plurality of recessed portions (first recessed portions) 12A and a plurality of recessed portions (second recessed portions) 12B having different shapes on the second primary surface 10b. The recessed portions 12A and 12B are arranged two-dimensionally in the x-axis direction and the y-axis direction on the second primary surface 10b. In the present embodiment, the recessed portions 12A and the recessed portions 12B are arranged two-dimensionally in a matrix pattern along the x-axis direction and the y-axis direction on the second primary surface 10b. The recessed portions 12A and the recessed portions 12B are arranged alternating with each other both in the x direction and in the y direction. The positions of the recessed portions 12A and 12B correspond to the positions of the optical function portions 11A and 11B on the first primary surface 10a. More specifically, it is preferred that the optical axes of the recessed portions 12A and 12B arranged on the second primary surface 10b and the optical axes of the optical function portions 11A and 11B provided on the first primary surface 10a generally coincide with each other. Where the light emitting module 100 only includes the optical function portions 11B arranged two-dimensionally on the first primary surface 10a as described above, the lightguide plate 10 may only include the recessed portions (second recessed portions) 12B on the second primary surface 10b as shown in FIG. 8B.

It is preferred that an opening 12Ab of the recessed portion 12A and an opening 12Bb of the recessed portion 12B on the second primary surface 10b are shaped and sized generally the same as the wavelength conversion member 20 to be described below. The shape of the openings 12Ab and 12Bb of the recessed portion 12A and the recessed portion 12B as seen from the second primary surface 10b may be generally rectangular or generally circular, for example. Where the arrangement pitch of the recessed portions 12A and the recessed portions 12B is generally the same in the x direction and in the y direction, it is preferred that the planar shape is a generally circular shape or a generally square shape. Then, the distribution of light emitted from the wavelength conversion member 20 can be made uniform for the two directions, and it is possible to suppress the unevenness of light emitted from the lightguide plate 10.

In the present embodiment, the recessed portion 12A includes an outer recessed portion 121A located on the second primary surface 10b and an inner recessed portion 122A located on a bottom surface 121Aa of the outer recessed portion 121A. As seen from the second primary surface 10b side (in a plan view), the inner recessed portion 122A is smaller than the outer recessed portion 121A. That is, the inner recessed portion 122A is formed on a portion of the bottom surface 121Aa. The outer recessed portion 121A forms a space in which the wavelength conversion member 20 to be described below is arranged.

The inner recessed portion 122A functions as an optical lens that adjusts the direction and distribution of light emitted from the wavelength conversion member 20. In the present embodiment, the inner recessed portion 122A has an inverted cone shape with a rounded apex as seen from the second primary surface 10b side. That is, the bottom of the recessed portion 12A has a shape that is protruding toward the first primary surface 10a side of the lightguide plate 10.

Similarly, the recessed portion 12B includes an outer recessed portion 121B located on the second primary surface 10b, and an inner recessed portion 122B located on a bottom surface 121Ba of the outer recessed portion 121B. As seen from the second primary surface 10b side (in a plan view), the inner recessed portion 122B is smaller than the outer recessed portion 121B. That is, the inner recessed portion 122B is formed on a portion of the bottom surface 121Ba. The outer recessed portion 121B forms a space in which the wavelength conversion member 20 to be described below is arranged.

The inner recessed portion 122B functions as an optical lens that adjusts the direction and distribution of light emitted from the wavelength conversion member 20. In the present embodiment, the inner recessed portion 122B has a cylindrical shape whose bottom portion has a curved surface that is protruding toward the recessed portion side as seen from the second primary surface 10b side. That is, the bottom portion of the recessed portion 12B has a shape that is protruding toward the second primary surface 10b side of the lightguide plate 10.

In the present embodiment, the inner recessed portion 122A of the recessed portion 12A and the inner recessed portion 122B of the recessed portion 12B are each a void, which is filled with air, etc. As seen from above, the shape of the inner recessed portion 122A and the inner recessed portion 122B is smaller than the outer recessed portion 121A and the outer recessed portion 121B. Note that in a plan view, the bottom surface 121Aa, 121Ba between the outer recessed portion 121A, 121B and the inner recessed portion 122A, 122B may be arranged entirely along the periphery of the inner recessed portion 122A, 122B or may be arranged along a portion of the periphery. The shape of the outer recessed portion 121A, 121B in a plan view and the shape of the inner recessed portion 122A, 122B in a plan view may be similar to each other or may be different from each other. Examples where they are different shapes include, for example, a case where the shape of the outer recessed portion 121A, 121B in a plan view is a circular shape and the shape of the inner recessed portion 122A, 122B in a plan view is a square shape, etc. It is preferred that in a plan view, the center of gravity of the outer recessed portion 121A, 121B and the center of gravity of the inner recessed portion 122A, 122B generally coincide with each other. Moreover, it is preferred that the center of gravity generally coincides with the optical axis of the light emitting element. The size of the outer recessed portion 121A, 121B in a plan view can be about 110% to 150% the size of the inner recessed portion 122A, 122B in a plan view, for example. The size of the inner recessed portion 122A, 122B in a plan view can be about 200% to 500% the size of the light emitting element 30 in a plan view, for example.

As described above, the wavelength conversion member 20 is arranged on the outer recessed portion 121A of the recessed portion 12A and the outer recessed portion 121B of the recessed portion 12B. On the other hand, the inner recessed portion 122A of the recessed portion 12A and the inner recessed portion 122B of the recessed portion 12B are each a void, which is filled with a gas such as air, etc.

With the lightguide plate 10 having such a structure, light emitted from the wavelength conversion member 20 enters the inside of the lightguide plate 10 through the inner recessed portion 122A of the recessed portion 12A and the inner recessed portion 122B of the recessed portion 12B. Then, since light travels from a low-refractive index region, which is a gas such as air, to a high-refractive index region, which is the lightguide plate 10, total reflection does not occur at the interface therebetween. Therefore, light emitted from the wavelength conversion member 20 can enter the inside of the lightguide plate 10 with a high efficiency.

The light emitting module 100 may include partition members that partition the light emitting elements from each other. In this case, the lightguide plate 10 may include a plurality of grooves 13x and a plurality of grooves 13y on the second primary surface 10b for arranging partition members therein. On the second primary surface 10b, the grooves 13x extend in the x direction, and are arranged between a plurality of rows of the recessed portions 12A and the recessed portions 12B arranged in the x direction. The grooves 13y extend in the y direction, and are arranged between a plurality of columns of the recessed portions 12A and the recessed portions 12B arranged in the y direction. The grooves 13x and the grooves 13y cross each other, and the recessed portions 12A and the recessed portions 12B are surrounded by the grooves 13x and the grooves 13y, and the regions surrounded by the grooves 13x and the grooves 13y each form a light emitting unit region of the light emitting module 100.

For example, the size of the optical function portions 11A and 11B and the recessed portions 12A and 12B in a plan view is about 0.05 mm or more and about 10 mm or less, preferably about 0.1 mm or more and about 1 mm or less. The depth is about 0.05 mm or more and about 4 mm or less, preferably about 0.1 mm or more and about 1 mm or less. There is no particular limitation on the bottom portions of the optical function portions 11A, and the optical function portions 11B and the bottom portions of the recessed portions 12A and the recessed portions 12B as long as they are spaced apart from each other. Note that "in a plan view" means to be seen in a direction perpendicular to the first primary surface 10a or the second primary surface 10b. The size of a shape is defined by the diameter of a circumcircle of the shape in a plan view.

The arrangement pitch of the optical function portions 11A and 11B is equal to the arrangement pitch of the light emitting element 30, e.g., about 0.05 mm or more and about 20 mm or less, preferably about 1 mm or more and about 10 mm or less.

For example, the size of the lightguide plate 10 is about 1 cm or more and about 200 cm or less each side, preferably about 3 cm or more and about 30 cm or less each side. The thickness of the lightguide plate 10 is about 0.1 mm or more and about 5 mm or less, and preferably about 0.5 mm or more and about 3 mm or less. The lightguide plate 10 may have any of various planar shapes depending on the application. The lightguide plate 10 may have a generally rectangular shape or a generally circular shape, for example.

The material of the lightguide plate 10 may be a resin material such as a thermoplastic resin such as acrylic, polycarbonate, cyclic polyolefin, polyethylene terephthalate and polyester or a thermosetting resin such as epoxy and silicone, or an optically transparent material such as glass. A thermoplastic resin material is particularly preferred because it can be manufactured efficiently by injection molding. Among others, polycarbonate, which is highly transparent and inexpensive, is preferred. When a light emitting device is manufactured by attaching an interconnect substrate after mounting the light emitting elements 30 on the lightguide plate 10, as will be described below, it is possible to omit a step such as solder reflow in which a high temperature is used can be omitted, making it possible to use even a material that is thermoplastic and has a low heat resistance such as polycarbonate.

The lightguide plate 10 can be formed by injection molding, transfer molding, thermal transfer, or the like, for example. It is preferred that the optical function portions 11A and 11B arranged on the first primary surface 10a of the lightguide plate 10 and the recessed portions 12A and 12B arranged on the second primary surface 10b are also formed integrally using a mold. Thus, it is possible to reduce the molding misalignment between the optical function portions 11A and 11B and the recessed portions 12A and 12B.

The lightguide plate 10 may be a single layer, or may include a plurality of light-transmitting layers that are layered together. When a plurality of light-transmitting layers are layered together, a layer having a different refractive index, e.g., an air layer, or the like, may be provided between any layers. Then, light can be diffused more easily, and it is possible to realize a light emitting module with reduced unevenness in luminance. Such a configuration can be realized by providing spacers between any light-transmitting layers, thereby spacing them apart and providing an air layer therebetween.

A light-transmitting layer may be provided on the first primary surface 10a and the second primary surface 10b of the lightguide plate 10 with spacers, or the like, interposed therebetween. Then, an air layer is formed between the lightguide plate 10 and the light-transmitting layer, and it is possible to better diffuse light. Therefore, it is possible to reduce the unevenness in luminance of light emitted from the light emitting module 100.

[Wavelength Conversion Member 20]

The wavelength conversion member 20 converts the wavelength of a portion of light emitted from the light emitting element 30. The wavelength conversion member 20 has a first primary surface 20a, a second primary surface 20b and the lateral surface 20c, and is provided in the outer recessed portion 121A of each of the recessed portions 12A provided on the second primary surface 10b of the lightguide plate 10 and in the outer recessed portion 121B of each of the recessed portions 12B provided on the second primary surface 10b of the lightguide plate 10. Specifically, the wavelength conversion members 20 are arranged in the outer recessed portions 121A and 121B so that the first primary surface 20a is in contact with the bottom surfaces 121Aa and 121Ba in the outer recessed portions 121A and 121B and an inner lateral surface 121Ac of the outer recessed portion 121A and an inner lateral surface 121Bc of the outer recessed portion 121B are in contact with the lateral surface 20c. Therefore, the lightguide plate 10 is arranged continuously over the wavelength conversion members 20 so that the second primary surface 10b faces the wavelength conversion member 20.

It is preferred that the wavelength conversion member 20 is a plate-shaped member. By using a plate-shaped member, the wavelength conversion members 20 can be arranged in the outer recessed portions 121A and 121B of the recessed portions 12A and 12B while the inner recessed portions 122A and 122B are left to remain as voids filled with air, or the like, without filling the voids with the wavelength conversion members 20.

For example, the wavelength conversion members 20 may be obtained by cutting a plate-shaped or sheet-shaped wavelength conversion material into individual pieces by cutting, punching, etc. Alternatively, small molded pieces of the wavelength conversion members 20 may be formed by a method such as injection molding, transfer molding method, compression molding, etc., using a mold, or the like. The wavelength conversion member 20 can be arranged in the outer recessed portion 121A of the recessed portion 12A and the outer recessed portion 121B of the recessed portion 12B by using an adhesive. It is preferred that the size and the shape of the wavelength conversion member 20 are about the same as those of the outer recessed portions 121A and 121B.

For example, the matrix of the wavelength conversion member 20 may be an epoxy resin, a silicone resin, a mixed resin thereof, or a light-transmitting material such as glass. In view of the lightfastness and the moldability, it is preferred to select a silicone resin as the matrix of the wavelength conversion member 20. It is preferred that the matrix of the wavelength conversion member 20 is a material having a higher refractive index than the material of the lightguide plate 10.

The wavelength conversion member 20 includes, as the wavelength conversion substance, a fluoride-based phosphor such as a YAG phosphor, a β-SiAlON phosphor or a KSF-based phosphor. Particularly, it is preferred that the wavelength conversion member 20 includes a plurality of types of wavelength conversion substances. For example, it is preferred that the wavelength conversion member 20 includes a β-SiAlON phosphor that emits light of greenish color and a fluoride-based phosphor such as a KSF-based phosphor that emits light of reddish color. Then, it is possible to obtain the light emitting module 100 capable of surface emitting light of whitish color. By using such a light emitting module 100, it is possible to expand the color reproduction range of the liquid crystal display device 1000. For example, when using the light emitting element 30 that emits light of bluish color, for example, the wavelength conversion member 20 may include 60 wt % or more, preferably 90 wt % or more, of a KSF-based phosphor (red phosphor) so as to obtain light of reddish color. That is, the wavelength conversion member 20 may include a wavelength conversion substance that emits light of a particular color so that light of the particular color is emitted. The wavelength conversion substance is not limited to a phosphor, but may be a quantum dot phosphor, or the like.

The wavelength conversion substance may be arranged in any manner inside the wavelength conversion member 20. For example, the wavelength conversion substance may be distributed generally evenly, or unevenly, inside the wavelength conversion member 20. For example, "distributed unevenly" means that the wavelength conversion substance is arranged so that the concentration is higher on the first surface 20a side or the second surface 20b side of the wavelength conversion member 20. Alternatively, it means that the wavelength conversion substance is arranged so that the concentration is higher near the center or near the periphery in a plan view. The wavelength conversion member 20 may include a plurality of layers, each including a wavelength conversion substance, that are layered together.

The wavelength conversion member 20 may include a material other than a wavelength conversion substance. For example, the wavelength conversion member 20 may include a diffuser. Specifically, the wavelength conversion member 20 may include fine particles of $SiO_2$, $TiO_2$, or the like, as a diffuser.

[Light Emitting Element 30]

The light emitting element 30 is a light source of the light emitting module 100. The light emitting module 100 includes a plurality of light emitting elements 30, and the light emitting elements 30 are attached to one lightguide plate 10 with the wavelength conversion members 20 interposed therebetween.

The light emitting element 30 includes the primary light emitting surface 30a from which light emission is primarily extracted, an electrode formation surface 30b located on the opposite side from the primary light emitting surface 30a, the lateral surface 30c located between the primary light emitting surface 30a and the electrode formation surface 30b, and a pair of electrodes 31 located on the electrode formation surface 30b. The electrodes 31 is electrically connected to an interconnect substrate 200 to be described later. The primary light emitting surface 30a of the light emitting element 30 is attached to the wavelength conversion member 20 with a light-transmitting attachment member 35 such as a light-transmitting resin interposed therebetween.

The light emitting element 30 includes a light-transmitting substrate of sapphire, or the like, and a semiconductor layer layered on the light-transmitting substrate, for example. The semiconductor layered structure includes a light emitting layer, and an n-type semiconductor layer and a p-type semiconductor layer with the light emitting layer sandwiched therebetween, wherein the electrodes 31 are electrically connected to the n-type semiconductor layer and the p-type semiconductor layer. It is preferred that the light emitting layer is formed from a nitride semiconductor ($In_xAl_yGa_{1-x-y}N$, $0 \leq X$, $0 \leq Y$, $X+Y \leq 1$) capable of emitting light of a short wavelength with which it is possible to efficiently excite the wavelength conversion substance of the wavelength conversion member 20.

There is no particular limitation on the size of the light emitting element 30. The size of the light emitting element 30 along the x and y directions in a plan view is 1000 µm or less, for example. The size along the x and y directions is preferably 500 µm or less, more preferably 200 µm or less. Using the light emitting element 30 of such a size, when an image is displayed on the liquid crystal display device 1000 by partially driving the light emitting module 100, it is possible to produce bright-dark contrast by smaller units, thereby realizing an image of a higher definition. When the light emitting element 30 whose size along the x and y directions is 500 µm or less is used, it is possible to procure the light emitting element 30 at low cost, and it is therefore possible to make the light emitting module 100 inexpensive. Note that with a light emitting element of which the size along the x direction and the size along the y direction are both 250 µm or less, the area of the upper surface of the light emitting element is small, thereby relatively increasing the amount of light emission from the lateral surface 30c of the light emitting element 30. That is, such a light emitting element 30, which has a batwing-shaped light distribution characteristic, can suitably be used in the light emitting module 100 of the present embodiment, where the distance between the lightguide plate 10 and the light emitting elements 30 is short.

Where a large number of light emitting elements 30 are attached to the wavelength conversion members 20, if the shape of the light emitting element 30 in a plan view is a rectangular shape, it is easy to visually find rotationally-misaligned light emitting elements 30. On the other hand, if the shape of the light emitting element 30 in a plan view is a rectangular shape, the mass productivity of the light emitting elements 30 is high. Moreover, the pitch in the x direction and the pitch in the y direction can be made equal to each other.

The arrangement of the light emitting elements 30 is dependent on the positions of the recessed portions 12A and the recessed portions 12B provided on the second primary surface 10b of the lightguide plate 10. Specifically, they are arranged so that the optical axes of the light emitting element 30 coincide with the optical axes of the recessed portions 12A and 12B. That is, the light emitting elements 30 are arranged two-dimensionally in the x-axis direction and the y-axis direction on the second primary surface 10b.

[Light-Transmitting Attachment Member 35]

As shown in FIG. 2C and FIG. 2D, the primary light emitting surface 30a of the light emitting element 30 may be attached to the wavelength conversion member 20 by the light-transmitting attachment member 35. Although not shown in the figures, the light-transmitting attachment member 35 may be arranged between the primary light emitting surface 30a of the light emitting element 30 and the wavelength conversion member 20. The light-transmitting attachment member 35 allows 60% or more, preferably 90% or more, of light emitted from the light emitting element 30 to pass therethrough. The light-transmitting attachment member 35 serves to propagate light emitted from the light emitting element 30 to the wavelength conversion member 20. Therefore, the light-transmitting attachment member 35 may possibly include a diffuser member, or the like, and it may be formed only of a light-transmitting resin material that does not include a diffuser member, or the like.

The light-transmitting attachment member 35 may cover the lateral surface 30c of the light emitting element 30. Moreover, it is preferred to cover the lateral surface of the light emitting layer of the light emitting element 30. Thus, it is possible to increase the light extraction efficiency of the light emitting module 100 by efficiently extracting light emitted in the direction of the lateral surface of the light emitting element 30 into the light-transmitting attachment member 35 so that the light enters the wavelength conversion member 20. When the light-transmitting attachment member 35 covers the lateral surface 30c of the light emitting element 30, it is preferred that a portion of the light-transmitting attachment member 35 that covers the lateral surface 30c is also in contact with the wavelength conversion member 20, and it is preferred that it has a shape that flares toward the direction of the wavelength conversion member 20. Thus, light emitted in the direction of the lateral surface 30c of the light emitting element 30 can efficiently enter the lightguide plate 10.

The material of the light-transmitting attachment member 35 may be a light-transmitting thermosetting resin material such as an epoxy resin or a silicone resin.

[Encapsulation Member 40]

The light emitting module 100 may include an encapsulation member 40 that covers and encapsulates the lateral surfaces 30c of the light emitting elements 30 and the second primary surface 10b of the lightguide plate 10. Thus, it is possible to protect the light emitting elements 30 and the lightguide plate 10 and to increase the strength of the light emitting module 100. Where the light-transmitting attachment members 35 are arranged on the lateral surfaces 30c of the light emitting elements 30, it is preferred that the encapsulation member 40 also covers the light-transmitting attachment members 35. The electrodes 31 of the light emitting elements 30 are exposed from the encapsulation member 40. By covering the second primary surface 10b of the lightguide plate 10, the encapsulation member 40 has a layered shape including a first primary surface 40a adjacent to the second primary surface 10b of the lightguide plate 10 and a second primary surface 40b located on the opposite side.

With the light emitting module 100 including partition members, by using a light-reflective member for the encapsulation member 40, it is possible to arrange the encapsulation member 40 in the grooves 13x and 13y provided on the second primary surface 10b of the lightguide plate 10, thereby forming partition members 41x and 41y. That is, portions of the encapsulation member 40 can function as partition members. The partition members 41x and 41y are configured corresponding to the grooves 13x and 13y arranged on the second primary surface 10b. That is, the light emitting module 100 may include a plurality of partition members 41x and a plurality of partition members 41y buried into the lightguide plate 10 with respect to the second primary surface 10b. The partition members 41x extend in the x direction, and are arranged between rows of the recessed portions 12A and the recessed portions 12B arranged in the x direction. The partition members 41y extend in the y direction, and are arranged between columns of the recessed portions 12A and the recessed portions 12B arranged in the y direction. The recessed portions 12A or the recessed portions 12B are surrounded by the partition members 41x and the partition members 41y, and regions surrounded by the partition members 41x and the partition members 41y each form a light emitting unit region of the light emitting module 100.

As described above, the partition members 41x and 41y are portions of the encapsulation member 40 that are arranged in the grooves 13x and 13y provided on the second primary surface 10b of the lightguide plate 10, and are reflective walls that are located on the first primary surface 40a and buried in the lightguide plate 10.

With the light emitting module 100 including the partition members 41x and 41y, light emitted from each light emitting element 30 is reflected by the partition members 41x and 41y that surround the recessed portion 12A or 12B corresponding to the light emitting element 30 to be emitted from the first primary surface 10a. When the light emitting module 100 is partially driven, it is possible to increase the bright-dark contrast, and it is possible to realize the liquid crystal display device 1000 capable of displaying an image that has a high contrast.

The light-reflective member used as the encapsulation member 40 has a reflectivity of 60% or more, preferably a reflectivity of 90% or more, for light emitted from the light emitting element 30.

It is preferred that the light-reflective member is a resin that contains a white pigment, or the like. Particularly, it is preferred to use a silicone resin that contains titanium oxide. Since the encapsulation member 40 needs to widely cover the lightguide plate 10, using an inexpensive substance such as titanium oxide, it is possible to reduce the manufacturing cost of the light emitting module 100.

[Interconnect 201]

For the electrical connection with the outside or the connection with the interconnect substrate 200, the light emitting module 100 may include interconnects 201 that are electrically connected to the electrodes 31 of the light emitting elements 30. The interconnects 201 may be formed on the second primary surface 40b of the encapsulation member 40. With the provision of the interconnects 201, the light emitting elements 30 can be electrically connected to each other, for example, and it is possible to form a circuit that is necessary when partially driving the light emitting module.

The interconnects 201 are formed from a conductive material such as a metal, and can be formed by using a thin film formation technique and a patterning technique, for example.

[Interconnect Substrate 200]

The light emitting module 100 may include the interconnect substrate 200. Since the interconnect substrate 200 can be provided in advance with an interconnect pattern thereon, the light emitting module 100 can include more complicated interconnects that are necessary for partial driving, etc., by including the interconnect substrate 200.

The interconnect substrate 200 may be any of interconnect substrates of various forms that are used for mounting semiconductor devices, etc. For example, the interconnect substrate 200 includes a plate-shaped or sheet-shaped base 210. The base 210 includes a first primary surface 210a and a second primary surface 210b, and an interconnect layer 212 is provided on the second primary surface 210b. A through hole extends from the first primary surface 210a to reach the interconnect layer 212 on the second primary surface 210b, and the through hole is filled with a conductive member 213. The conductive member 213 is exposed on the first primary surface 210a.

The base 210 is attached to the encapsulation member 40 with the first primary surface 210a opposing a surface 40b of the encapsulation member 40 so that the conductive member 213 is electrically connected to the electrode 31 of the light emitting element 30 or the interconnect 201. Since the interconnect 201 can be made larger than the electrode 31 of the light emitting element 30, the provision of the interconnect 201 increases the alignment tolerance and facilitates the attachment of the interconnect substrate 200.

The base 210 may be a ceramic or a resin, for example. In view of the low cost and moldability, a resin may be selected as the material of the base 210. The resin may be a composite material such as phenolic resin, epoxy resin, polyimide resin, BT resin, polyphthalamide (PPA), polyethylene terephthalate (PET), unsaturated polyester, glass epoxy, etc. It may be a rigid substrate or a flexible substrate. With the light emitting module 100, the light emitting element 30 is attached to the wavelength conversion member 20 secured on the lightguide plate 10. In other words, the light emitting element 30 is supported on the lightguide plate 10. Therefore, the interconnect substrate 200 does not need to have the function of supporting the light emitting element 30, and the base 210 may be of a material that is inexpensive and thermally deformable such as glass epoxy or a sheet material that is thin and deformable. The thickness of the base 210 is about 100 μm to 500 μm, for example.

The material of the interconnect layer 212 may be any of various materials that are conductive. It is preferred that the interconnect layer 212 has a high thermal conductivity. For example, it may be a conductive material such as copper. The interconnect layer 212 may be formed by plating or conductive paste application or printing, etc. The thickness of the interconnect layer 212 is about 5 to 50 μm, for example.

The interconnect substrate 200 may be attached to the lightguide plate 10, etc., by any method. For example, the attachment can be achieved by arranging and pressure-bonding a sheet-shaped adhesive sheet between the second primary surface 40b of the encapsulation member 40 and a first primary surface 200a of the interconnect substrate 200. The electric connection between the conductive member 213 and the electrode 31 of the light emitting element 30 or the interconnect 201 can be made by any method. For example, the conductive member 213 can be melted using pressure and heat so as to be attached to the interconnect 201.

Note that the interconnect substrate 200 may have a layered structure. For example, the interconnect substrate 200 may be a metal plate with an insulative layer provided on the surface thereof. The interconnect substrate 200 may include active parts such as TFTs (Thin-Film Transistors) and passive parts such as capacitors and resistors, and mounted on the interconnect layer 212 of the second primary surface 210b.

[Characteristic of Light Emitting Module]

With the light emitting module 100, the wavelength conversion member 20, to which the light emitting element 30 is connected, is arranged in the recessed portion 12 of the lightguide plate 10, and it is therefore possible to reduce the overall thickness of the light emitting module 100. Since the lightguide plate 10 is in contact with the lateral surface of the wavelength conversion member 20, light emitted from the lateral surface of the wavelength conversion member 20 can also enter the lightguide plate 10 and be extracted. In the lightguide plate 10, while light emitted from the light emitting element 30 passes through the wavelength conversion member 20, a portion of the passing light is converted to light of a different wavelength, and is emitted into the recessed portion 12. At this point, light is refracted at the interface between the recessed portion 12 and the lightguide plate 10, and the recessed portion 12 functions as an optical lens that changes the light transmission direction by diverging and converging light passing through the interface. Therefore, the light distribution is adjusted by the recessed portion 12, and it is possible to adjust the light distribution even if the distance from the light emitting element to the first primary surface, which is the emission surface of the light emitting module 100, thereby realizing a thin backlight.

Particularly, where a void is provided between the bottom portion of the recessed portion 12 and the wavelength conversion member 20 or where a material having a lower refractive index than the material of the lightguide plate 10 is arranged therebetween, when light emitted from the light emitting element 30 travels from the recessed portion 12 into the lightguide plate 10, the light passes through a region of a low refractive index and then a region of a high refractive index. Therefore, no total reflection occurs at the interface between the recessed portion 12 and the lightguide plate 10, and it is possible to improve the light extraction efficiency of the light emitting module 100.

The light emitting element 30 may be bonded on the lightguide plate 10. The bonding makes it possible to reduce the error in the alignment of the light emitting element 30 with respect to the lightguide plate 10, and it is possible to realize a light emitting module that has good optical characteristics. Where the optical function portions 11A and 11B, which function as optical lenses, are provided also on the first primary surface 10a of the lightguide plate 10, it is possible to also reduce the alignment error between the optical function portions 11A and 11B and the light emitting element 30.

With the lightguide plate 10 including the recessed portions 12 and the optical function portions 11A and 11B, which function as optical lenses, light emitted from the light emitting element 30 can be adjusted through two optical lenses, and it is possible to emit light having a light distribution that is suitable for backlight by adjusting the light emission direction within a shorter distance. With the light emitting module 100 of the present embodiment, the thickness of the light emitting module 100 can be set to 5 mm or less, 3 mm or less, 1 mm or less, for example.

(Method for Manufacturing Light Emitting Module)

Referring to FIG. 4A to FIG. 4G, an example of a method for manufacturing a light emitting module of the present disclosure will now be described.

Figure 4A:
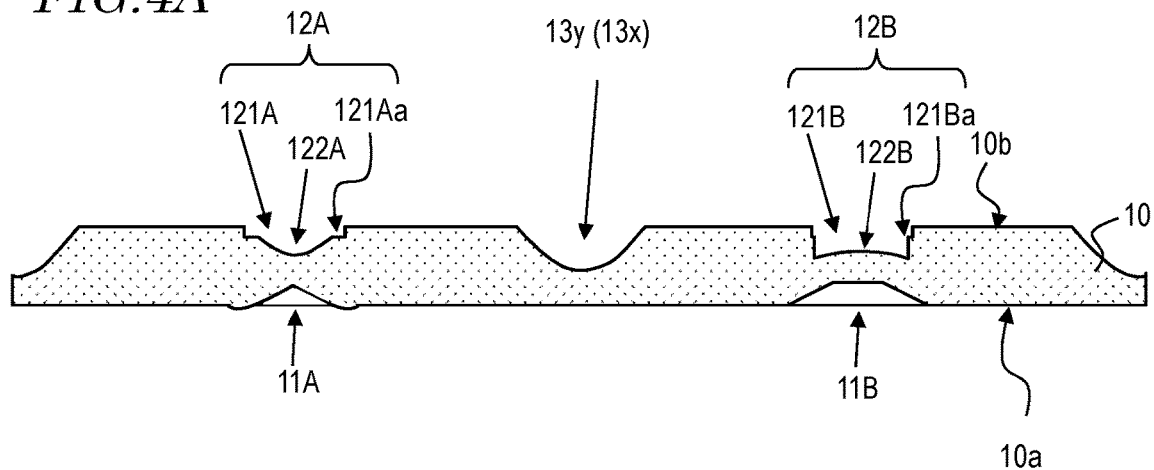
FIG. 4A is a schematic cross-sectional view showing a step in a method for manufacturing a light emitting module of an embodiment of the present disclosure.

First, as shown in FIG. 4A, the lightguide plate 10 having the first primary surface 10a and the second primary surface 10b and including a plurality of recessed portions 12A and 12B located on the second primary surface 10b is provided. For example, the lightguide plate 10 made of polycarbonate is provided by injection molding, with a plurality of optical function portions 11A and 11B provided on the first primary surface 10a and a plurality of recessed portions 12A and 12B and a plurality of grooves 13x and 13y provided on the second primary surface 10b.

Figure 4B:
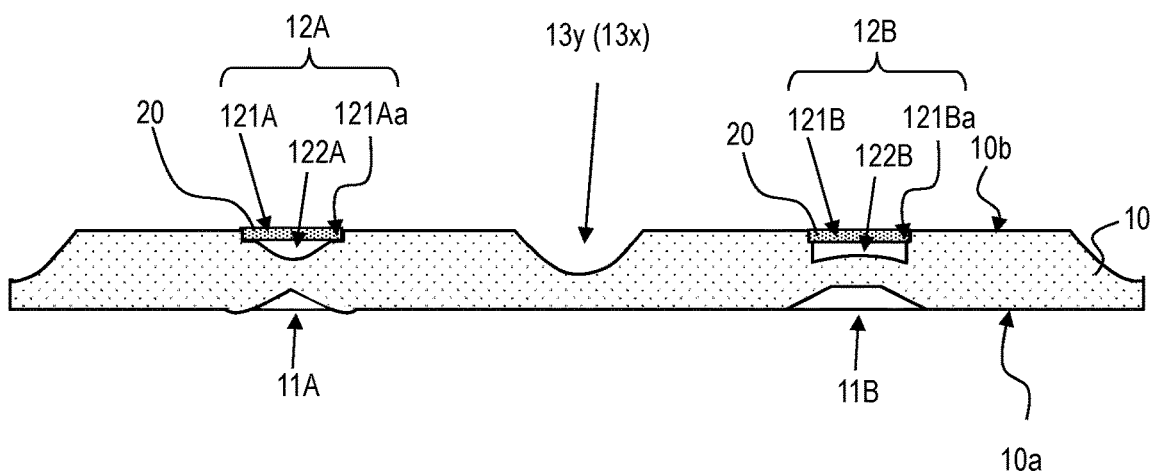
FIG. 4B is a schematic cross-sectional view showing a step in a method for manufacturing a light emitting module of an embodiment of the present disclosure.

Next, as shown in FIG. 4B, a plurality of wavelength conversion members 20 are arranged in the recessed portions 12A and 12B so that at least a portion thereof is in contact with the inner lateral surface of the recessed portions 12A and 12B of the lightguide plate 10 and so that it is spaced apart from the bottom surface of the recessed portions 12A and 12B. Specifically, the lightguide plate 10 is held with the first primary surface 10a facing down, and the wavelength conversion members 20 are arranged on the outer recessed portions 121A of the recessed portions 12A and the outer recessed portions 121B of the recessed portions 12B of the lightguide plate 10 using an adhesive, or the like. Since the inner recessed portions 122A and 122B are formed in a portion of the bottom surfaces 121Aa and 121Ba of the outer recessed portion 121A, the wavelength conversion members 20 are in contact with and secured on the bottom surfaces 121Aa and are in contact with the inner lateral surface of the outer recessed portions 121A, and 121B. Therefore, the inner recessed portions 122A and 122B become voids, and the wavelength conversion members 20 are arranged while being spaced apart from the bottom portions of the inner recessed portions 122A and 122B, which are the bottom portions of the recessed portions 12A and 12B.

Figure 4C:
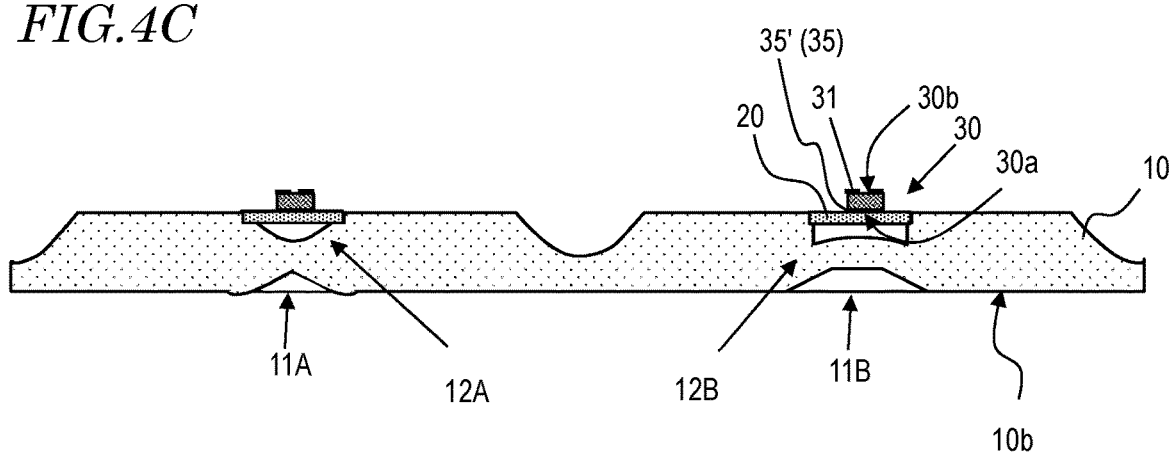
FIG. 4C is a schematic cross-sectional view showing a step in a method for manufacturing a light emitting module of an embodiment of the present disclosure.

Next, as shown in FIG. 4C, the light emitting elements 30 are attached respectively to the wavelength conversion members 20 so that the primary light emitting surfaces 30a face the wavelength conversion members 20. Specifically, a material 35' of the light-transmitting attachment member is arranged on the wavelength conversion member 20, and the light emitting element 30 is placed thereon. The light emitting element 30 is arranged on the wavelength conversion member 20 so that the primary light emitting surface 30a thereof faces the wavelength conversion member 20. Then, the material 35' of the light-transmitting attachment member is allowed to cure, thereby obtaining the light-transmitting attachment member 35 and attaching the light emitting element 30 and the wavelength conversion member 20 together. At this point, the lateral surface 30c of the light emitting element 30 may be covered by the material of the light-transmitting attachment member 35. Since the primary light emitting surface 30a faces the wavelength conversion member 20, the electrode formation surface 30b, on which the electrode 31 is provided, faces up.

Figure 4D:
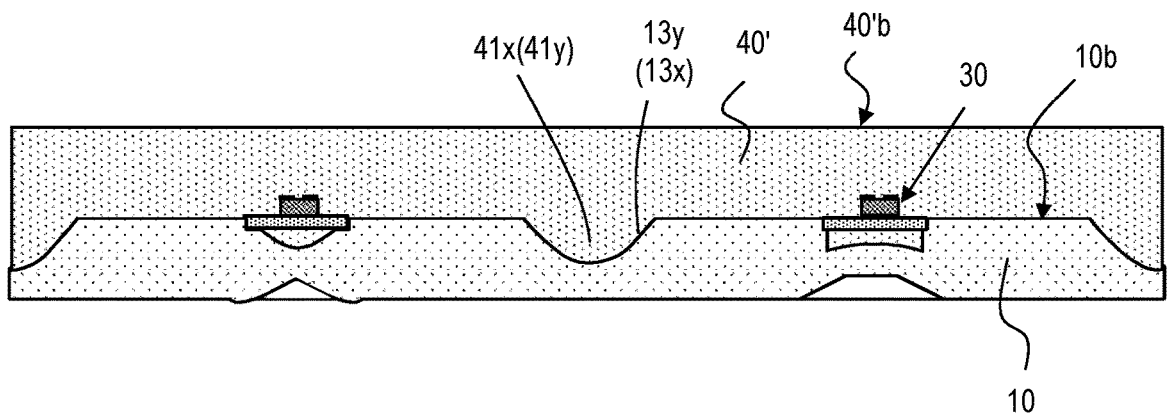
FIG. 4D is a schematic cross-sectional view showing a step in a method for manufacturing a light emitting module of an embodiment of the present disclosure.

Next, as shown in FIG. 4D, an encapsulation member 40' covering the entire light emitting elements 30 is formed on the second primary surface 10b of the lightguide plate 10. The material of the encapsulation member is arranged on the second primary surface 10b of the lightguide plate 10 so as to bury the light emitting elements 30 and to fill the grooves 13x and 13y on the second primary surface 10b, and the material is allowed to cure. Thus, the partition members 41x and 41y are formed in the grooves 13x and 13y, and the entire light emitting elements 30 are covered by the encapsulation member 40'. The encapsulation member 40' can be formed by a method such as transfer molding, potting, printing, spraying, etc., for example.

Figure 4E:
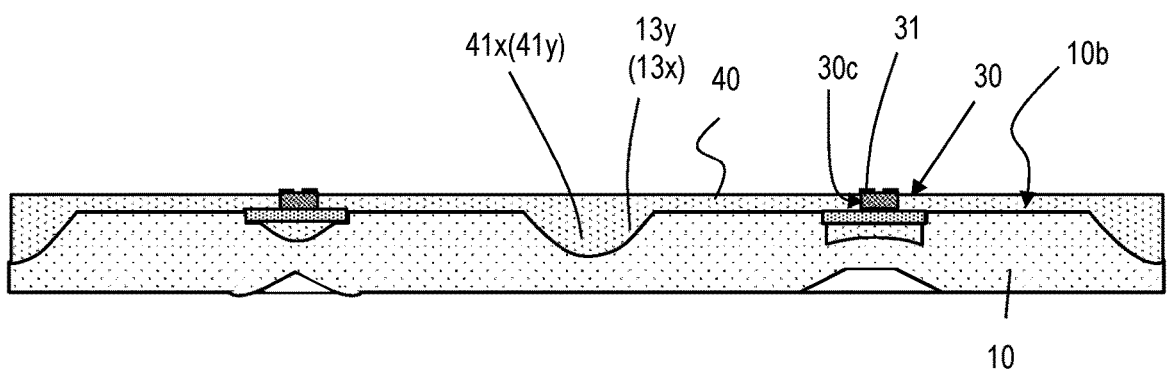
FIG. 4E is a schematic cross-sectional view showing a step in a method for manufacturing a light emitting module of an embodiment of the present disclosure.

Next, the encapsulation member 40' is polished or ground from a second primary surface 40'b so as to expose the electrodes 31 of the light emitting elements 30. Polishing or grinding may be done by using a planarization technique such as a chemical method, e.g., CMP used for manufacturing semiconductor devices, or a mechanical method such as sandblast or grindstone. Then, as shown in FIG. 4E, the encapsulation member 40 is obtained that covers the lateral surface 30c of the light emitting element 30, with the surface of the electrode 31 exposed.

Figure 4F:
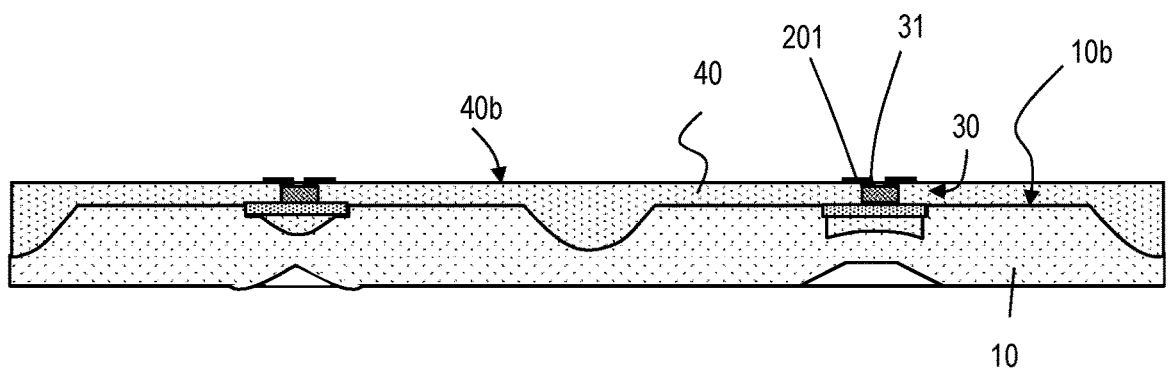
FIG. 4F is a schematic cross-sectional view showing a step in a method for manufacturing a light emitting module of an embodiment of the present disclosure.

Next, a metal film having a layered structure of Cu/Ni/Au is formed entirely across the second primary surface 40b of the encapsulation member 40 covering the surfaces of the electrodes 31 by a thin film formation technique such as sputtering, and is patterned by laser abrasion in which the film is irradiated with laser light, thereby forming the interconnects 201 connected to the electrodes 31 on the second primary surface 40b of the encapsulation member 40 as shown in FIG. 4F.

Figure 4G:
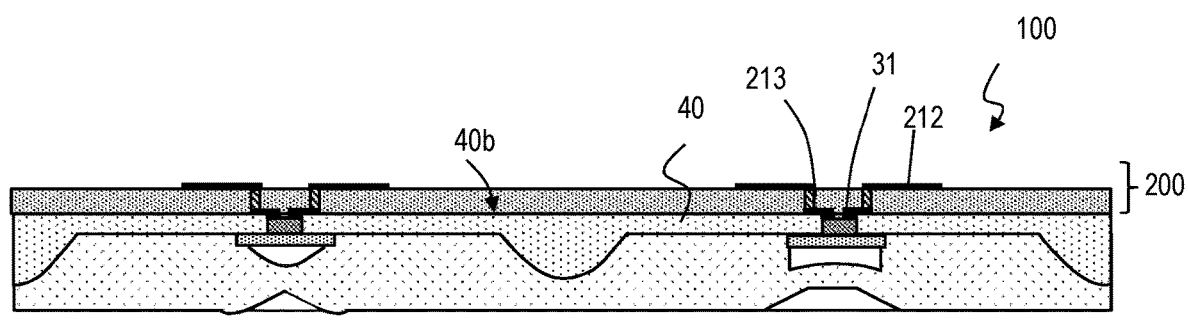
FIG. 4G is a schematic cross-sectional view showing a step in a method for manufacturing a light emitting module of an embodiment of the present disclosure.

Next, as shown in FIG. 4G, the interconnect substrate 200 is arranged on the second primary surface 40b of the encapsulation member 40 with an adhesive sheet interposed therebetween, and the interconnect substrate 200 is pressure-bonded to the encapsulation member 40. At this point, the conductive member 213 is partially melted using pressure and heat, thereby electrically connecting the conductive member 213 and the interconnect 201 together. Thus, it is possible to obtain the light emitting module 100.

OTHER EMBODIMENTS

In the embodiment described above, on the lightguide plate 10 of the light emitting module, a void is provided between the bottom portion of the recessed portion 12A, 12B and the wavelength conversion member 20. However, a light-transmitting material having a low refractive index may be arranged therein, instead of a void.

Figure 5A:
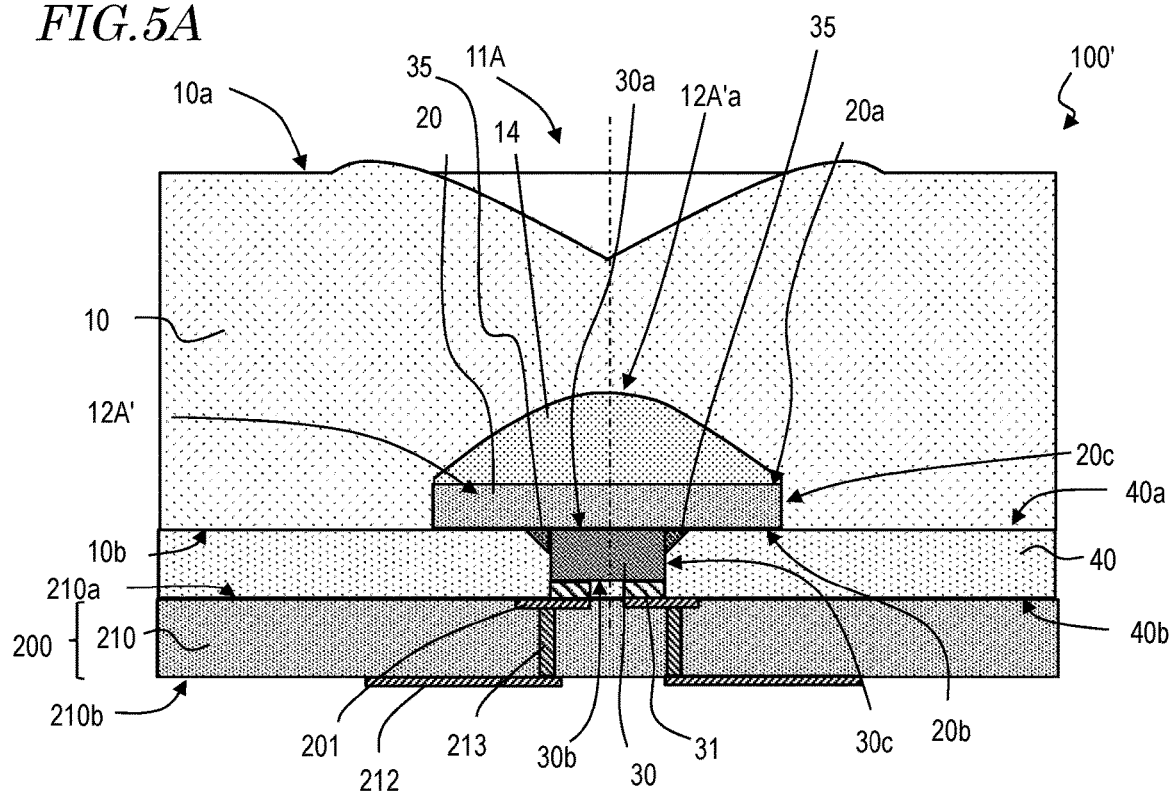
FIG. 5A is a schematic enlarged cross-sectional view showing another example of a light emitting module of an embodiment of the present disclosure.
Figure 5B:
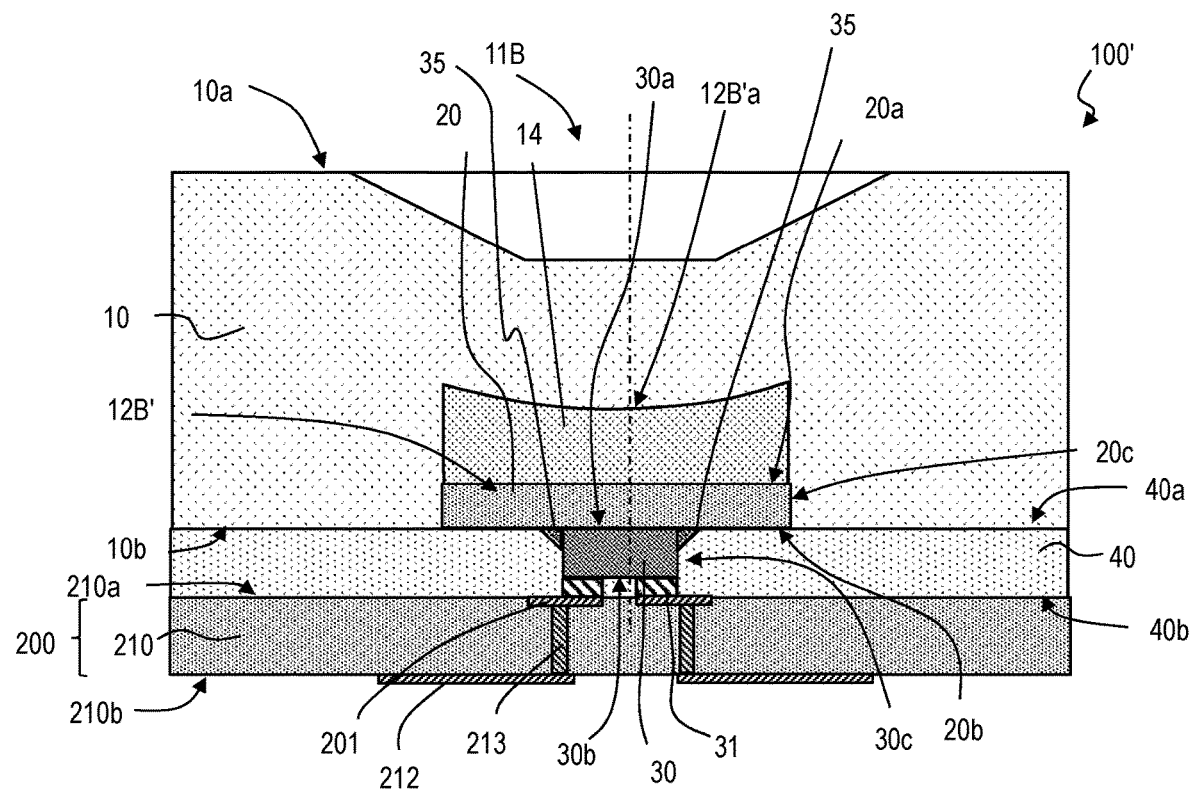
FIG. 5B is a schematic enlarged cross-sectional view showing another example of a light emitting module of an embodiment of the present disclosure.
Figure 6A:
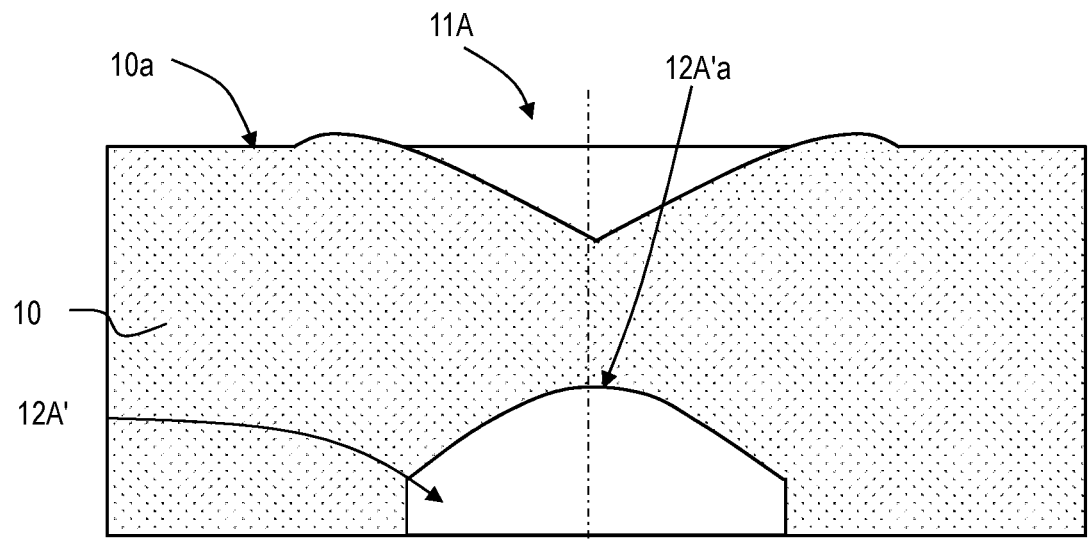
FIG. 6A is a schematic cross-sectional view of a lightguide plate of the light emitting module of FIG. 5A.
Figure 6B:
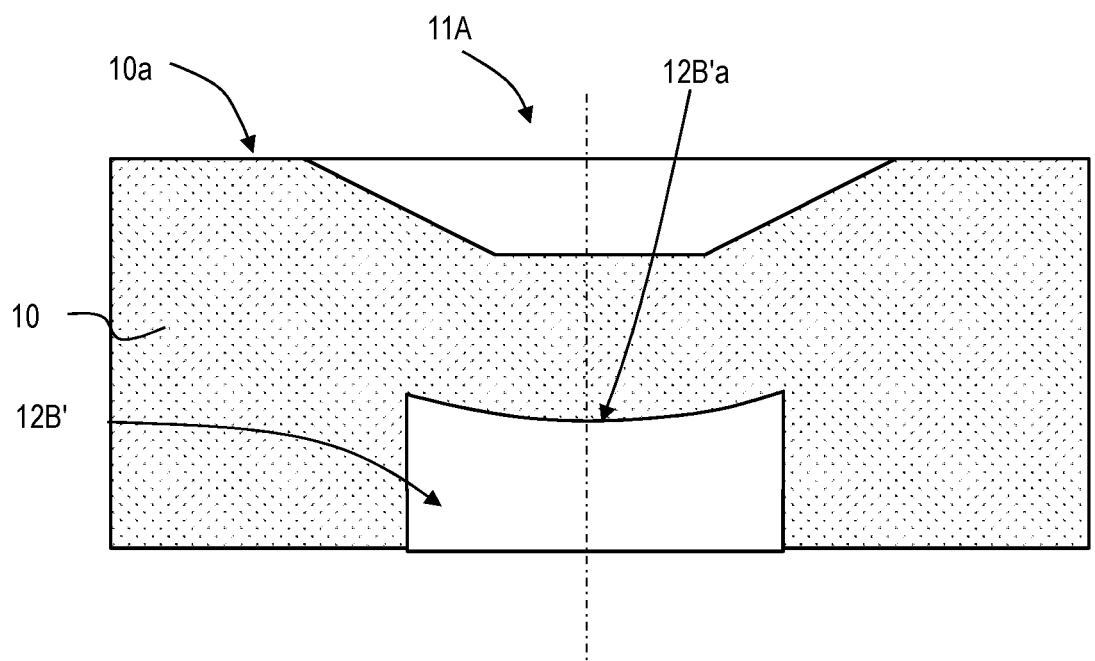
FIG. 6B is a schematic cross-sectional view of a lightguide plate of the light emitting module of FIG. 5B.

FIG. 5A and FIG. 5B each show an enlarged cross section of an important part of a light emitting module 100' having such a structure. FIG. 6A and FIG. 6B show cross sections of the lightguide plate 10 at positions corresponding to FIG. 5A and FIG. 5B, respectively.

With the light emitting module 100' shown in FIG. 5A and FIG. 5B, recessed portions 12A' and 12B' are provided on the second primary surface 10b of the lightguide plate 10. The light emitting module 100' includes a light-transmitting low-refractive index member 14 that partially fills the recessed portion 12A', 12B' to a predetermined height (depth) from the bottom surface 12A'a, 12'Ba of the recessed portion 12A', 12B'. The wavelength conversion member 20 is in contact with the light-transmitting low-refractive index member 14 in the recessed portion 12A', 12B'. The light-transmitting low-refractive index member 14 is transmissive for light emitted from the light emitting element 30, and has a smaller refractive index than the lightguide plate 10. The light-transmitting low-refractive index member 14 may be of a light-transmitting thermosetting resin material such as an epoxy resin or a silicone resin, etc. For example, when the lightguide plate 10 made of polycarbonate is used, a silicone resin, or the like, can suitably be used.

Also with the light emitting module 100', light emitted from the wavelength conversion member 20 travels from the light-transmitting low-refractive index member 14, which is a region of a low refractive index, into the lightguide plate 10, which is a region of a high refractive index. Therefore, total reflection is unlikely to occur at the interface therebetween. Therefore, light emitted from the wavelength conversion member 20 can enter the inside of the lightguide plate 10 with a high efficiency.

Figure 7A:
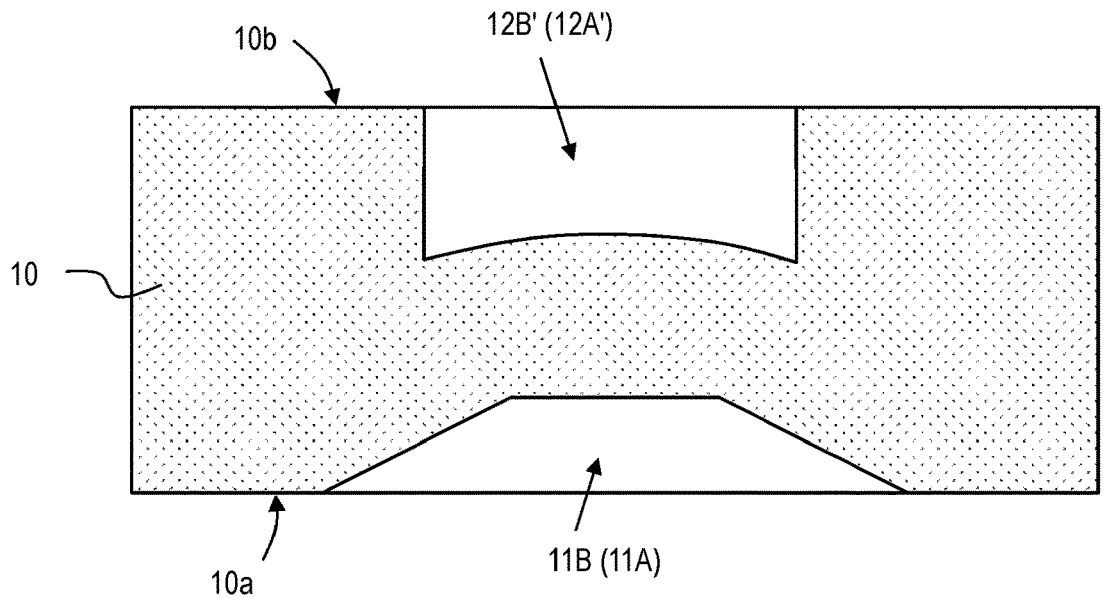
FIG. 7A is a schematic cross-sectional view showing a step in a method for manufacturing a light emitting module of another embodiment of the present disclosure.

When manufacturing the light emitting module 100', as shown in FIG. 7A, the lightguide plate 10 having the first primary surface 10a and the second primary surface 10b and a plurality of recessed portions 12A' and 12B' located on the second primary surface 10b is provided.

Figure 7B:
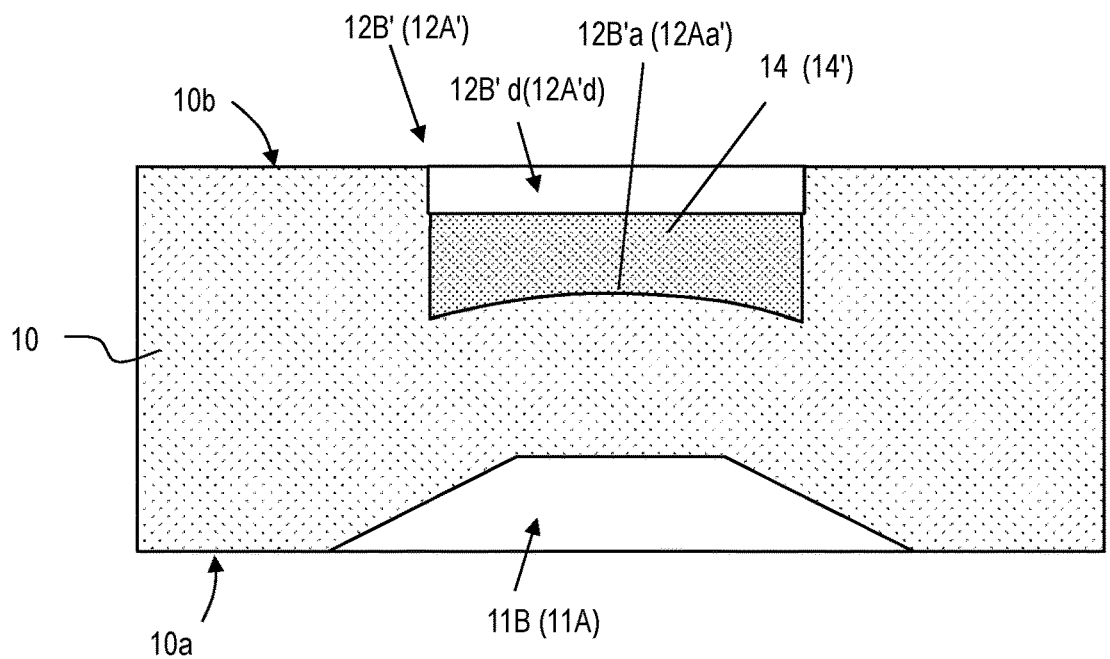
FIG. 7B is a schematic cross-sectional view showing a step in a method for manufacturing a light emitting module of another embodiment of the present disclosure.

Next, as shown in FIG. 7B, a material 14' of a light-transmitting low-refractive index member fills to a predetermined height from the bottom of the recessed portion 12A', 12B'. Then, the material 14' of the light-transmitting low-refractive index member is allowed to cure, thereby arranging the light-transmitting low-refractive index member 14 in the recessed portions 12A, 12B' having a predetermined height from the bottom surface 12A'a, 12B'a.

Figure 7C:
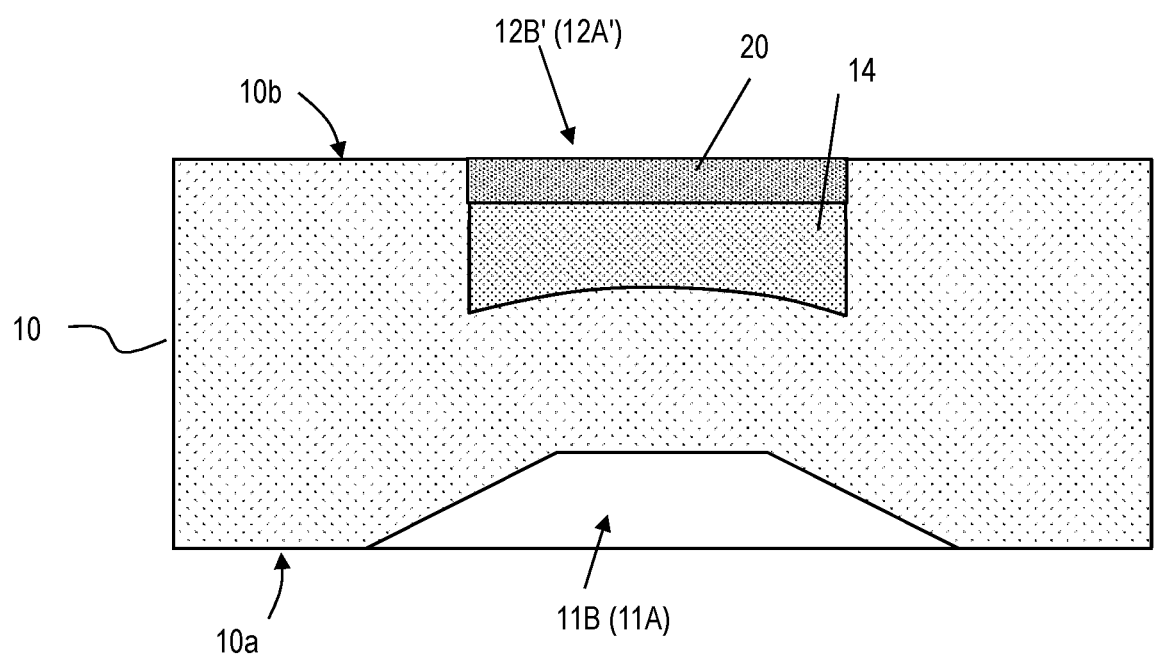
FIG. 7C is a schematic cross-sectional view showing a step in a method for manufacturing a light emitting module of another embodiment of the present disclosure.

Next, as shown in FIG. 7C, the wavelength conversion member 20 is arranged in the recessed portion 12A', 12B' so as to be in contact with the light-transmitting low-refractive index member 14. At this point, the plate-shaped wavelength conversion member 20 may be arranged in the recessed portion 12A', 12B', or the space 12A'd, 12B'd in the recessed portion 12A', 12B', where the light-transmitting low-refractive index member 14 is absent, may be filled with the wavelength conversion member 20, which is then allowed to cure.

Thereafter, a similar method to that of the embodiment described above is used to obtain the light emitting module 100'.

The light emitting module of the present disclosure is applicable to various surface-emitting light sources, and can be used as a backlight of a liquid crystal display device, for example.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light emitting module comprising:
    a plurality of light emitting elements each having a primary light emitting surface and a lateral surface;
    a plurality of wavelength conversion members arranged respectively on the primary light emitting surfaces of the plurality of light emitting elements; and
    a lightguide plate having a first primary surface and a second primary surface and arranged continuously on the plurality of wavelength conversion members so that the second primary surface faces the plurality of wavelength conversion members, wherein the lightguide plate includes a plurality of recessed portions located on the second primary surface, and a lateral surface of at least one of the plurality of wavelength conversion members is partially in contact with an inner lateral surface of at least one of plurality of the recessed portions.

2. The light emitting module according to claim 1, wherein:
    each of the plurality of recessed portions includes an outer recessed portion located on the second primary surface, and an inner recessed portion located on a bottom surface of the outer recessed portion;
    each of the plurality of wavelength conversion members is arranged in the outer recessed portion; and
    the inner recessed portion is a void.

3. The light emitting module according to claim 2, wherein in each of the plurality of recessed portions, the inner recessed portion is smaller than the outer recessed portion in a plan view.

4. The light emitting module according to claim 1, further comprising:
    a light-transmitting low-refractive index member having a lower refractive index than the lightguide plate and filling at least a portion of each recessed portion to a predetermined height from a bottom of the recessed portion,
    wherein at least one of the plurality of wavelength conversion members is in contact with the light-transmitting low-refractive index member.

5. The light emitting module according to claim 4, wherein each of the plurality of wavelength conversion members is smaller than each of the plurality of recessed portion in a plan view.

6. The light emitting module according to claim 1, wherein the plurality of recessed portions include a plurality of first recessed portions and a plurality of second recessed portions, wherein a bottom of each of the plurality of first recessed portions has a different shape than a bottom of each of the plurality of second recessed portions.

7. The light emitting module according to claim 6, wherein a bottom of each of the plurality of first recessed portions has a shape that is protruding toward the first primary surface side, and a bottom of each of the plurality of second recessed portions has a shape that is protruding toward the second primary surface side.

8. The light emitting module according to claim 1, wherein the lightguide plate further includes a plurality of optical function portions arranged on the first primary surface at positions corresponding to the plurality of recessed portions on the second primary surface.

9. The light emitting module according to claim 8, wherein optical axes of the plurality of optical function portions generally coincide with optical axes of the plurality of recessed portions on the second primary surface.

10. The light emitting module according to claim 2, wherein the plurality of recessed portions include a plurality of first recessed portions and a plurality of second recessed portions, wherein a bottom of each of the plurality of first recessed portions has a different shape than a bottom of each of the plurality of second recessed portions.

11. The light emitting module according to claim 10, wherein a bottom of each of the plurality of first recessed portions has a shape that is protruding toward the first primary surface side, and a bottom of each of the plurality of second recessed portions has a shape that is protruding toward the second primary surface side.

12. The light emitting module according to claim 4, wherein the plurality of recessed portions include a plurality of first recessed portions and a plurality of second recessed portions, wherein a bottom of each of the plurality of first recessed portions has a different shape than a bottom of each of the plurality of second recessed portions.

13. The light emitting module according to claim 12, wherein a bottom of each of the plurality of first recessed portions has a shape that is protruding toward the first primary surface side, and a bottom of each of the plurality of second recessed portions has a shape that is protruding toward the second primary surface side.

* * * * *